United States Patent
Othieno et al.

(10) Patent No.: US 6,801,437 B2
(45) Date of Patent: Oct. 5, 2004

(54) ELECTRONIC ORGANIC SUBSTRATE

(75) Inventors: Maurice O. Othieno, Union City, CA (US); Manickam Thavarajah, San Jose, CA (US); Severino A. Legaspi, Jr., Santa Clara, CA (US); Pradip D. Patel, Redwood City, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/347,759

(22) Filed: Jan. 21, 2003

(65) Prior Publication Data

US 2004/0142556 A1 Jul. 22, 2004

(51) Int. Cl.⁷ .......................... H05K 1/18; H01L 21/44
(52) U.S. Cl. .................. 361/761; 361/762; 361/779; 438/674; 428/32.1
(58) Field of Search ............................ 361/761, 762, 361/779

(56) References Cited

U.S. PATENT DOCUMENTS 5,932,355 A * 8/1999 Iqbal et al. ................ 428/32.1
6,219,253 B1 * 4/2001 Green ........................ 361/761

* cited by examiner

Primary Examiner—David Nelms
Assistant Examiner—Renee R. Berry
(74) Attorney, Agent, or Firm—Luedeka, Neely & Graham, P.C.

(57) ABSTRACT

A method of forming electrically conductive elements on a base layer of an electronic substrate without the use of solder mask. A layer of electrically conductive material is deposited on the base layer, and a first layer of photo imageable ink is applied over the electrically conductive material layer. The first layer of photo imageable ink is patterned to expose portions of the electrically conductive material layer, which are then etched to resolve traces in the electrically conductive material layer. The first layer of photo imageable ink is removed, and a second layer of photo imageable ink is applied over the traces and channels between the traces. The second layer of photo imageable ink is then patterned to expose the traces, and a third layer of photo imageable ink is applied over the traces and the second layer of photo imageable ink. The third layer of photo imageable ink is patterned to expose deposition sites on the traces, within which are formed electrically conductive fingers. Both the second layer and the third layer of photo imageable ink are retained on the electronic substrate.

18 Claims, 1 Drawing Sheet

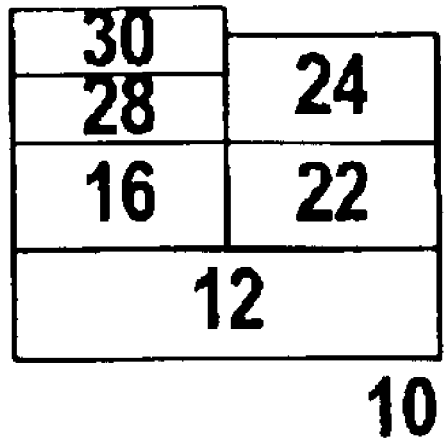
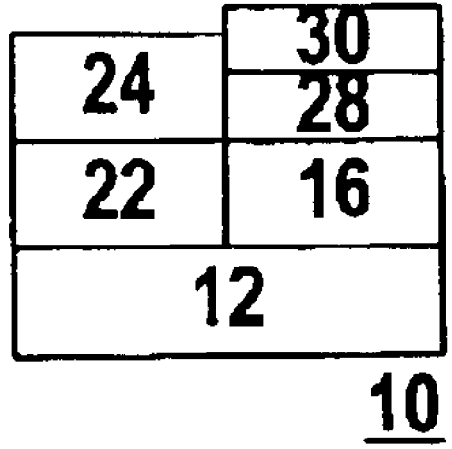

Fig. 1
Fig. 2
Fig. 3
Fig. 4
Fig. 5
Fig. 6
Fig. 7
Fig. 8
Fig. 9
Fig. 10
Fig. 11
Fig. 12

ELECTRONIC ORGANIC SUBSTRATE

FIELD

This invention relates to the field of integrated circuit fabrication. More particularly, this invention relates to fabrication of electronic organic substrates on which monolithic integrated circuits are mounted.

BACKGROUND

Electronic organic substrates, also called printed circuit boards or package substrates, are used as a platform for monolithic integrated circuits, such as array products like ball grid arrays, to which the monolithic integrated circuit is mounted and encapsulated.

The package substrate is typically formed of several electrically conductive layers, sandwiched between non electrically conductive layers and a non electrically conductive core. The electrically conductive layers, typically formed of a metal such as copper, are used for power and signal routing. The non electrically conductive core provides structural strength to the substrate, and reduces damage to the package from stresses such as those induced by mechanical load and thermal energy.

Typically, a copper layer is deposited on the core material and then a layer of photo imageable ink is applied to the copper layer. A pattern is exposed on the photo imageable, to expose portions of the copper layer, which are then etched away. A layer of solder mask material is then applied over portions of the patterned copper layer, and additional electrically conductive materials, such as nickel and gold, are plated on the exposed portions of the patterned copper layer. A final layer of solder mask may then additionally be applied.

Unfortunately, there are several problems with the present methods. For example, there is no current method for directly controlling the width of the materials that are plated on the copper layer, as they can grow out sideways from the copper layer across the substrate. Thus, the features formed in this manner can only be so close together, or they may grow together and form electrically conductive bridges during the plating process. In addition, the non electrically conductive solder mask is typically applied in a screen printing operation. Because geometries can only be reduced to a certain level with screen printing, designers are not able to define electrically conductive traces that are as fine or as close together as may be desired.

What is needed, therefore, is a method of fabricating electronic organic substrates that overcomes at least some of these and other problems.

SUMMARY

The above and other needs are met by a method of forming electrically conductive elements on a base layer of an electronic substrate without the use of solder mask. A layer of electrically conductive material is deposited on the base layer, and a first layer of photo imageable ink is applied over the electrically conductive material layer. The first layer of photo imageable ink is patterned to expose portions of the electrically conductive material layer, which are then etched to resolve traces in the electrically conductive material layer. The first layer of photo imageable ink is removed, and a second layer of photo imageable ink is applied over the traces and channels between the traces. The second layer of photo imageable ink is then patterned to expose the traces, and a third layer of photo imageable ink is applied over the traces and the second layer of photo imageable ink. The third layer of photo imageable ink is patterned to expose deposition sites on the traces, within which are formed electrically conductive fingers. Both the second layer and the third layer of photo imageable ink are retained on the electronic substrate.

In this manner, the second layer of photo imageable ink is used to constrain the lateral growth of the electrically conductive fingers within the deposition sites, and the traces can be formed at a finer pitch. In addition, because the photo imageable ink can be patterned at a finer resolution than the solder mask can be screen printed, the traces can be formed at an even finer pitch. Thus, the improvements of the present invention enable the fabrication of an electronic substrate having conductive elements that are placed at a finer pitch.

In various preferred embodiments there is an additional step of leveling the second layer of photo imageable ink with the traces prior to applying the third layer of photo imageable ink. Preferably the base layer comprises at least one of bismaleimide triazine, flex circuit, and FR4. The electrically conductive material preferably comprises copper, and is most preferably formed to a thickness of between about six mils and about eighteen mils. However, thicker copper tends to be better, and even greater thicknesses may be used. The step of forming electrically conductive fingers preferably comprises first plating a layer of nickel and then plating a layer of gold within the deposition sites. The bottom layer preferably has a thickness of between about five microns and about fifteen microns, and the top layer preferably has a thickness of between about one half micron and about one and one half micron. Preferably, the first layer of photo imageable ink, the second layer of photo imageable ink, and the third layer of photo imageable ink are all formed of a photo imageable ink, such as is commonly available. In one embodiment the base layer is singulated into several concurrently fabricated electronic substrates.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein:

FIG. 1 is a cross sectional depiction of a portion of a base layer of an electronic substrate, FIG. 2 is a cross sectional depiction of a portion of a base layer of an electronic substrate that is overlaid with an electrically conductive layer, FIG. 3 is a cross sectional depiction of a portion of an electronic substrate, where the conductive layer has been overlaid with a first photo imageable ink, FIG. 4 is a cross sectional depiction of a portion of an electronic substrate, where a first photo imageable ink has been patterned, FIG. 5 is a cross sectional depiction of a portion of an electronic substrate, where an electrically conductive layer has been etched, FIG. 6 is a cross sectional depiction of a portion of an electronic substrate, where the first photo imageable ink has been removed, FIG. 7 is a cross sectional depiction of a portion of an electronic substrate, where a second photo imageable ink has been patterned between conductive traces, FIG. 8 is a cross sectional depiction of a portion of an electronic substrate, where the second photo imageable ink has been leveled, FIG. 9 is a cross sectional depiction of a portion of an electronic substrate, where a third layer of photo imageable ink has been deposited, FIG. 10 is a cross sectional depiction of a portion of an electronic substrate, where the third layer of photo imageable ink has been patterned, FIG. 11 is a cross sectional depiction of a portion of an electronic substrate, where additional conductive layers have been formed over an exposed portion of the electrically conductive layer, and FIG. 12 is a cross sectional depiction of a portion of an electronic substrate, where the electronic substrate has been singulated into more than one electronic substrate.

DETAILED DESCRIPTION

With reference now to FIG. 1, there is depicted a portion of an electronic substrate 10, with a base layer 12. The base layer 12 is preferably formed of one or more of bismaleimide triazine, flex circuit, and FR4. The electronic substrate 10 is therefore preferably an organic electronic substrate 10, of the type adapted to receive an integrated circuit, such as a ball grid array flip chip integrated circuit, and other associated circuits. The processing of the electronic substrate 10 commences, in portion relevant to this disclosure, by forming a layer of an electrically conductive material 14 on top of the base layer 12, as depicted in FIG. 2. The electrically conductive material 14 is most preferably copper which is formed to a thickness of between about six mils and about eighteen mils, and most preferably about twelve mils, such as formed by an electroless plating process, but may be some other electrically conductive material, and deposited by some other process. However, thicker copper tends to be better, and even greater thicknesses than those described herein may be used.

As seen in FIG. 3, a first layer 18 of a photo imageable ink is formed over the electrically conductive layer 14. The photo imageable ink 18 is preferably one such as is commonly available, provided that it is compatible with the materials, processes, and structures as generally described and implied herein. The first layer 18 of photo imageable ink is preferably patterned, as depicted in FIG. 4, such as with a photolithographic process, where the photo imageable ink is exposed to a projected image, developed, and hard baked.

Once the desired image has been formed in the first layer 18 of the photo imageable ink, the underlying electrically conductive layer 14 is preferably etched to define traces 16. The exposed portions of the base layer 12 where the electrically conductive layer 14 has been removed are referred to as channels 20 between the traces 16. The first layer 18 of photo imageable ink is removed from the traces 16, as depicted in FIG. 6, leaving the traces 16 disposed between channels 20 on the base layer 12 of the electronic substrate 10.

A second layer 22 of photo imageable ink is preferably formed on the electronic substrate 10, and patterned so as to only remain within the channels 20 between the traces 16. The second layer 22 of photo imageable ink is preferably the same material as the first layer 14 of photo imageable ink. The various patterning steps, generally and briefly described above, are not reiterated here, so as to not unduly detract from the more important aspects of the invention. The second layer 22 of photo imageable ink might be thicker than the traces 16. If so, then the electronic substrate is optionally and preferably leveled so as to reduce the height of the second layer 22 of photo imageable ink 22 to about the same height as the traces 16, as depicted in FIG. 8.

A third layer 24 of photo imageable ink 24 is preferably formed over the electronic substrate 9, and patterned as depicted in FIG. 10 to expose portions of the traces 16, which are referred to herein as deposition sites 26. The deposition sites 26 preferably have a width that is substantially equal to the width of the traces 16. The deposition sites 26 are preferably those sites through which electrical connections between the electronic substrate 10 and the integrated circuit which is mounted thereon are made. The third layer 24 of photo imageable ink 24 is preferably the same material as the first layer 14 of photo imageable ink and the second layer 22 of photo imageable ink.

Most preferably, electrically conductive fingers are formed within the deposition sites 26, such as by plating one or more electrically conductive materials. In most preferred embodiment, a layer of nickel 28 is first deposited to a thickness of between about five microns and about fifteen microns, and most preferably about ten microns, and then a layer of gold is next deposited to a thickness of between about one half micron and about one and one half micron, and most preferably about one micron, as depicted in FIG. 11. The electronic substrate 10 so formed may then be singulated into multiple electronic substrates 10, such as represented in FIG. 12. However, it is appreciated that the representations of the electronic substrates 10 as depicted in FIG. 12 are partial representations only, and that in actual embodiment, the electronic substrates 10 so singulated would preferably be substantially identical and much larger and more complex.

At least one monolithic integrated circuit is then preferably affixed to the individualized electronic substrate 10. Most preferably the integrated circuit is encapsulated against the electronic substrate 10.

The second and third layers 22 and 24 of photo imageable ink are preferably retained on the electronic substrate 10. In this manner, the third layer 24 of photo imageable ink provides electrical masking functions similar to those that are typically provided by a solder mask layer, which is not required in the embodiments of the present invention. Further, the second layer 22 of photo imageable ink substantially prohibits the electrically conductive materials 28 and 30 from forming in the channels 20 between the traces 16, and possibly shorting between the traces 16.

Thus, the methods of the present invention allow the traces 16 to be placed closer together that could previously be accomplished with a typical solder mask process, because the placement and critical dimensions of the photo imageable ink can be much more precisely controlled.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. In a method of forming electrically conductive elements on a base layer of an electronic substrate without the use of solder mask, the improvement comprising:
   depositing a layer of electrically conductive material on the base layer,
   applying a first layer of photo imageable ink over the electrically conductive material layer,
   patterning the first layer of photo imageable ink to expose portions of the electrically conductive material layer,
   etching the exposed portions of the electrically conductive material layer to resolve traces in the electrically conductive material layer,
   removing the first layer of photo imageable ink,
   applying a second layer of photo imageable ink over the traces and channels between the traces,
   patterning the second layer of photo imageable ink to expose substantially all of the traces,
   applying a third layer of photo imageable ink over the traces and the second layer of photo imageable ink,
   patterning the third layer of photo imageable ink to expose deposition sites on a portion of the traces,
   forming electrically conductive fingers within the exposed deposition sites, and
   retaining the second layer and the third layer of photo imageable ink on the electronic substrate.

2. The method of claim 1, further comprising the step of leveling the second layer of photo imageable ink with the traces prior to applying the third layer of photo imageable ink.

3. The method of claim 1 wherein the base layer comprises at least one of bismaleimide triazine, flex circuit, and FR4.

4. The method of claim 1 wherein the electrically conductive material comprises copper.

5. The method of claim 1 wherein the step of forming electrically conductive fingers comprises first plating a layer of nickel and then plating a layer of gold within the deposition sites.

6. The method of claim 1 wherein the first layer of photo imageable ink, the second layer of photo imageable ink, and the third layer of photo imageable ink are all formed of a common photo imageable ink.

7. The method of claim 1, further comprising the step of singulating several electronic substrates one from another that are concurrently fabricated.

8. The method of claim 1 wherein the electrically conductive fingers are formed of a bottom layer having a thickness of between about five microns and about fifteen microns and a top layer having a thickness of between about one half micron and about one and one half micron.

9. An electronic substrate formed according to the method of claim 1.

10. A packaged integrated circuit having an electronic substrate formed according to the method of claim 1.

11. In a method of forming electrically conductive elements on a base layer of an electronic substrate without the use of solder mask, the improvement comprising:
    depositing a layer of copper on the base layer,
    applying a first layer of photo imageable ink over the copper layer,
    patterning the first layer of photo imageable ink to expose portions of the copper layer,
    etching the exposed portions of the copper layer to resolve traces in the copper layer,
    removing the first layer of photo imageable ink,
    applying a second layer of photo imageable ink over the traces and channels between the traces,
    patterning the second layer of photo imageable ink to expose substantially all of the traces,
    applying a third layer of photo imageable ink over the traces and the second layer of photo imageable ink,
    patterning the third layer of photo imageable ink to expose deposition sites on a portion of the traces,
    forming electrically conductive fingers within the exposed deposition sites, the electrically conductive fingers having a lower layer of nickel and an upper layer of gold, and
    retaining the second layer and the third layer of photo imageable ink on the electronic substrate.

12. The method of claim 11, further comprising the step of leveling the second layer of photo imageable ink with the traces prior to applying the third layer of photo imageable ink.

13. The method of claim 11 wherein the base layer comprises a bismaleimide triazine substrate.

14. The method of claim 11 wherein the base layer comprises a flex circuit substrate.

15. The method of claim 11 wherein the base layer comprises an FR4 circuit substrate.

16. The method of claim 11 wherein the first layer of photo imageable ink, the second layer of photo imageable ink, and the third layer of photo imageable ink are all formed of a common photo imageable ink.

17. The method of claim 11, further comprising the step of singulating several electronic substrates one from another that are concurrently fabricated.

18. In a method of forming electrically conductive elements on a bismaleimide triazine base layer of an electronic substrate without the use of solder mask, the improvement comprising:
    depositing a layer of copper on the base layer,
    applying a first layer of photo imageable ink over the copper layer,
    patterning the first layer of photo imageable ink to expose portions of the copper layer,
    etching the exposed portions of the copper layer to resolve traces in the copper layer,
    removing the first layer of photo imageable ink,
    applying a second layer of photo imageable ink over the traces and channels between the traces,
    patterning the second layer of photo imageable ink to expose substantially all of the traces,
    leveling the second layer of photo imageable ink with the traces,
    applying a third layer of photo imageable ink over the traces and the second layer of photo imageable ink,
    patterning the third layer of photo imageable ink to expose deposition sites on a portion of the traces,
    forming electrically conductive fingers within the exposed deposition sites, the electrically conductive fingers having a lower layer of nickel and an upper layer of gold,
    retaining the second layer and the third layer of photo imageable ink on the electronic substrate, and
    singulating the base layer into several electronic substrates.

* * * * *